United States Patent
Tanimoto

(10) Patent No.: US 7,580,264 B2
(45) Date of Patent: Aug. 25, 2009

(54) POWER SUPPLY AND FIXING STRUCTURE OF HEATSINK AND CIRCUIT BOARD APPLICABLE TO THE SAME

(75) Inventor: Yoshihide Tanimoto, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

(21) Appl. No.: 11/331,060

(22) Filed: Jan. 13, 2006

(65) Prior Publication Data

US 2006/0158859 A1 Jul. 20, 2006

(30) Foreign Application Priority Data

Jan. 14, 2005 (JP) ............................. 2005-007744

(51) Int. Cl.
  H05K 7/20 (2006.01)
  H01L 23/495 (2006.01)
  F28F 7/00 (2006.01)
  H02B 1/01 (2006.01)

(52) U.S. Cl. ................... 361/719; 361/707; 361/709; 257/675; 165/80.2; 165/185; 439/564

(58) Field of Classification Search ................. 257/675; 361/688, 719, 707, 709; 165/80.2, 185; 439/564
See application file for complete search history.

(56) References Cited

U.S. PATENT DOCUMENTS

| | | | | |
|---|---|---|---|---|
| 3,893,161 A | * | 7/1975 | Pesak, Jr. ..................... 257/718 |
| 4,403,102 A | * | 9/1983 | Jordan et al. ................ 174/16.3 |
| 4,521,827 A | * | 6/1985 | Jordan et al. ................ 361/704 |
| 4,538,025 A | * | 8/1985 | Coe et al. ..................... 174/561 |
| 4,625,260 A | * | 11/1986 | Jordan et al. ................ 361/720 |
| 4,646,203 A | * | 2/1987 | Ngo et al. ................... 361/708 |
| 4,695,924 A | * | 9/1987 | Wozniczka ................. 361/720 |
| 4,724,514 A | * | 2/1988 | Kaufman .................... 361/710 |
| 4,808,119 A | * | 2/1989 | Pfaff .......................... 439/268 |
| 4,847,449 A | * | 7/1989 | Jordan et al. ............. 174/138 G |
| 5,001,547 A | * | 3/1991 | Romano ..................... 257/712 |
| 5,019,942 A | * | 5/1991 | Clemens ..................... 361/709 |
| 5,053,923 A | * | 10/1991 | Niemetz ..................... 361/709 |
| 5,313,701 A | * | 5/1994 | Klinger et al. ................ 29/840 |
| 5,343,362 A | * | 8/1994 | Solberg ...................... 361/710 |
| 5,587,608 A | * | 12/1996 | Meng ......................... 257/712 |

(Continued)

FOREIGN PATENT DOCUMENTS

JP   6-41192   5/1994

(Continued)

*Primary Examiner*—Jayprakash N Gandhi
*Assistant Examiner*—Bradley H Thomas
(74) *Attorney, Agent, or Firm*—Crowell & Moring LLP

(57) ABSTRACT

A power supply of an image forming device with a heatsink fixed on a circuit board using an iron rivet is described. The rivet is fastened using a riveter. A crimped portion at a tip of the rivet, a bottom face of the heatsink, an end portion of a flange of the rivet and a land portion of the circuit board are firmly connected to each other to stabilize their electrical connection. The rivet is electrically connected to the land portion by the binding strength of the rivet and the dipped solder. Thus, the heatsink is securely connected to a grounding line of the circuit board in a simple process.

3 Claims, 4 Drawing Sheets

U.S. PATENT DOCUMENTS

| | | | |
|---|---|---|---|
| 5,844,312 A * | 12/1998 | Hinshaw et al. | 257/718 |
| 5,901,781 A * | 5/1999 | Arai et al. | 165/80.3 |
| 5,991,151 A * | 11/1999 | Capriz | 361/704 |
| 6,128,190 A * | 10/2000 | Hardin et al. | 361/704 |
| 6,243,265 B1 * | 6/2001 | Wong et al. | 361/704 |
| 6,304,449 B1 * | 10/2001 | Zhang | 361/704 |
| 6,310,776 B1 * | 10/2001 | Byrne et al. | 361/707 |
| 6,483,702 B1 * | 11/2002 | Lofland | 361/704 |
| 6,781,840 B2 * | 8/2004 | Ikushima et al. | 361/707 |
| 6,984,887 B2 * | 1/2006 | Umezu et al. | 257/706 |
| 2002/0131238 A1 * | 9/2002 | Fisher et al. | 361/719 |
| 2004/0238947 A1 * | 12/2004 | Rumer et al. | 257/707 |

FOREIGN PATENT DOCUMENTS

| | | | |
|---|---|---|---|
| JP | 2002118218 A * | 4/2002 | |
| JP | 2003-46027 A | 2/2003 | |

* cited by examiner

POWER SUPPLY AND FIXING STRUCTURE OF HEATSINK AND CIRCUIT BOARD APPLICABLE TO THE SAME

BACKGROUND OF THE INVENTION

1. Field of the Invention

The present invention relates to a power supply in an electronic apparatus such as an image forming apparatus, and a circuit board and a fixing structure for fixing a heatsink (radiator) for radiating heat generated by an electronic component, such as a power transistor installed on the circuit board, which are applicable to the power supply.

2. Description of the Related Art

In a power supply for supplying electric power to each unit of an electronic apparatus, such as an image forming device, it is necessary to supply relatively large amounts of electric power stably, so that an electronic component forming a circuit such as a power transistor generates a large amount of heat. Thus, a heatsink serving as a radiator for radiating the heat generated in the electronic component is provided on a circuit board of the power supply, so as to protect the electronic component against the heat.

FIGS. 5 to 7 show a heatsink used in a circuit board of a conventional power supply and a fixing structure of the heatsink. The power supply has a circuit board 101 on which a wiring pattern is formed, an electronic component 102, such as a power transistor, installed on the circuit board 101 in an upright position, a heatsink 103 attached to the circuit board 101 in an upright position and a conductor 120 for electrically connecting a grounding line of the circuit board 101 to the heatsink 103. The heatsink 103 is formed by bending an aluminum plate in a substantially right-angular cornered U-letter shape, and the electronic component 102 is closely mounted on a component attachment face 105 of both opposed faces of the heatsink 103. The conductor 120 made of iron is attached to a back face 106 opposed to the component attachment face 105. A bottom face 107, which couples the component attachment face 105 to the back face 106, is brought into contact with the circuit board 101.

The electronic component 102 is attached to the heatsink 103 at substantially the center thereof by use of a screw 108. In order to prevent interference with terminals of the electronic component 102, the component attachment face 105 of the heatsink 103 is cut on the periphery of the terminals. A convex portion 121, which comes into contact with a tip of the conductor 120, is provided on the back face 106 of the heatsink 103, and a bearing portion 122 for supporting a shaft of the conductor 120, is provided between the convex portion 121 and the bottom face 107. The convex portion 121 and the bearing portion 122 are formed by press working, for example. A fixing portion 123, which protrudes in a shape of a hook for fixing the heatsink 103 on the circuit board 101, is provided at bottom ends of a pair of opposed corner portions on the component attachment face 105 and the back face 106. The fixing portion 123 is inserted into a rectangular hole 124 provided on the circuit board 101, and then is twisted while being held by a tool such as pliers prior to a dipping process, thereby engaging with the periphery of the rectangular hole 124 to fix the heatsink 103 to the circuit board 101. FIG. 5 shows the state where the fixing portion 123 is inserted into the rectangular hole 124, and FIG. 7 shows the state where the twisted fixing portion 123 engages with the periphery of the rectangular hole 124.

A front end of the conductor 120 comes into contact with the convex portion 121, and the other front end thereof penetrates through a through hole 125 formed on the circuit board 101 and is soldered to a land portion 111 provided on the circuit board 101. The land portion 111 is connected to the grounding line of the circuit board 101, so that the heatsink 103 is electrically connected to the grounding line of the circuit board 101 via the conductor 120. Soldering of the conductor 120 is performed by being dipped into a molten solder tank simultaneously with soldering of the electronic component 102.

In such a conventional power supply, it is adopted that the heatsink 103 is fixed on the circuit board 101 by engaging the twisted fixing portion 123 with the periphery of the rectangular hole 124. The heatsink 103 made of aluminum, however, cannot be directly fixed on the circuit board 101 by solder, so that there may be cases where the heatsink 103 cannot be completely fixed on the circuit board 101. Furthermore, since the heatsink 103 is formed of an aluminum plate, it is easily deformed. When the heatsink 103 is subjected to shock or vibration for any reason, a clearance may occur between the fixing portion 123 and the periphery of the rectangular hole 124. In such a case, the contact between the conductor 120 and the heatsink 103 becomes unstable, so that it causes a conduction failure and the operation of the power supply becomes unstable. Furthermore, the process of bringing the bottom face 107 of the heatsink 103 into close contact with the circuit board 101 while stably contacting the conductor 120 against the convex portion 121, and twisting the fixing portion 123 being held by pliers or the like, requires some experience and imposes a burden on the operator.

On the other hand, Japanese Laid-Open Utility Model Publication No. 6-41192 discloses a grounding metal fitting having the same function as the conductor 120 in the power supply shown in FIGS. 5 to 7. However, the ground metal portion cannot solve the above-mentioned problems. In addition, Japanese Laid-Open Patent Publication No. 2003-46027 discloses a heat radiation configuration of a ball grid array.

SUMMARY OF THE INVENTION

The present invention is conceived to solve the above problems of the conventional power supply and the conventional fixing structure of the heatsink on the circuit board, and to provide a power supply in which a heatsink can be securely connected to a grounding line of a circuit board so that stable operation can be obtained in a simple process requiring no experience and excess burden on the operator, and a fixing structure of a heatsink on a circuit board used for the power supply at low cost.

A power supply in accordance with an aspect of the present invention includes a circuit board on which a wiring pattern is formed, an electronic component installed on the circuit board in an upright position, and a heatsink made of aluminum and attached to the circuit board in an upright position so as to be closely adhered to the electronic component for radiating heat generated from the electronic component.

The heatsink is fixed on the circuit board using a rivet made of iron. The heatsink has a cross section substantially in a right-angular cornered U-letter shape, the electronic component is fixed on one of opposing faces forming the U-letter shape, and a bottom face of the heatsink coupling the opposing faces is in contact with the circuit board. The bottom face of the heatsink has a first rivet insertion hole through which a tip of the rivet penetrates. The circuit board has a second rivet insertion hole provided at a position corresponding to the first rivet insertion hole of the heatsink and a land portion provided on a periphery of the second rivet insertion hole so as to come into contact with an end portion of a flange of the rivet inserted into the second rivet insertion hole. The land portion is connected to a grounding line of the circuit board. The heatsink is fixed on the circuit board with the rivet inserted into the first and second rivet insertion holes, the land portion is electrically connected to the end portion of the flange of the rivet with certainty, i.e. securely, by using a solder dip through a gap between them and their peripheries, and the electrical connection between the grounding line of the circuit board and the heatsink is ensured via the rivet.

With such a configuration, since the heatsink is fixed on the circuit board with the rivet made of iron which can be soldered in an extremely rigid manner, the electrical connection between the rivet and the heatsink can be stabilized. Furthermore, since the rivet is electrically connected to the land portion securely due to the binding strength of the rivet and the dipped solder, the electrical connection between the rivet and the land portion can be also ensured. As a result, the heatsink can be electrically connected to the grounding line securely and the operation of the power supply can be stabilized. Still furthermore, since the heatsink is easily fixed to the circuit board while these components are closely adhered to each other by using a riveter driven by oil pressure or the like, the burden imposed on the operator can be reduced in comparison with the conventional process of twisting the fixing portion being held with pliers, or the like, and the productivity of the power supply can be improved.

A circuit board in accordance with another aspect of the present invention includes an electronic component and a heatsink made of aluminum for radiating heat generated from the electronic component, which are installed thereon. The heatsink is fixed on the circuit board with a rivet made of a material which can be soldered and an electrical connection between the heatsink and the circuit board is ensured by soldering the rivet to a grounding line on the circuit board.

With such configuration, the heatsink is rigidly fixed to the circuit board with the rivet, and the rivet is securely connected to the grounding line on the circuit board by soldering. As a result, the operation of the circuit board can be stabilized.

A fixing structure of a heatsink on a circuit board on which a wiring pattern is formed in accordance with still another aspect of the present invention is characterized by the following features.

An electronic component is installed on the circuit board in an upright position. The heatsink is attached to the circuit board in an upright position so as to closely contact the electronic component for radiating heat generated by the electronic component. The heatsink has a component fixing face on which the electronic component is fixed and a board contact face which is orthogonal to the component fixing face and in contact with the circuit board. The board contact face of the heatsink has a first rivet insertion hole through which a tip of a rivet penetrates. The circuit board has a second rivet insertion hole provided at a position corresponding to the first rivet insertion hole of the heatsink, and a land portion provided on a periphery of the second rivet insertion hole so as to come into contact with an end portion of a flange of the rivet inserted into the second rivet insertion hole. The land portion is connected to a grounding line of the circuit board. The heatsink is fixed on the circuit board with the rivet inserted into the first and second rivet insertion holes, and the electrical connection between the grounding line of the circuit board and the heatsink is ensured via the rivet.

With such configuration, since the heatsink is rigidly fixed on the circuit board with the rivet, the electrical connection between the rivet and the conductor can be stabilized. Furthermore, the rivet is electrically connected to the land portion securely due to the binding strength of the rivet, and the electrical connection between the rivet and the land portion can be also ensured. As a result, the heatsink can be electrically connected to the grounding line securely. Since the heatsink is easily fixed on the circuit board while these components are contacted to each other by using a riveter driven by oil pressure or the like, a burden imposed on the operator can be reduced in comparison with the conventional process of twisting the fixing portion being held with pliers or the like.

In the heatsink fixing structure, it is preferable that the heatsink is made of aluminum, the rivet is made of a material which can be soldered, and the land portion is electrically connected to the end portion of the flange of the rivet securely by a solder dip through a gap between both the portions and its periphery.

With such configuration, since the heatsink is fixed to the circuit board with the rivet made of a material which can be soldered, the rivet is electrically connected to the land portion securely by the joint strength of the rivet and the dipped solder.

DETAILED DESCRIPTION OF THE EMBODIMENT

Figure 1:
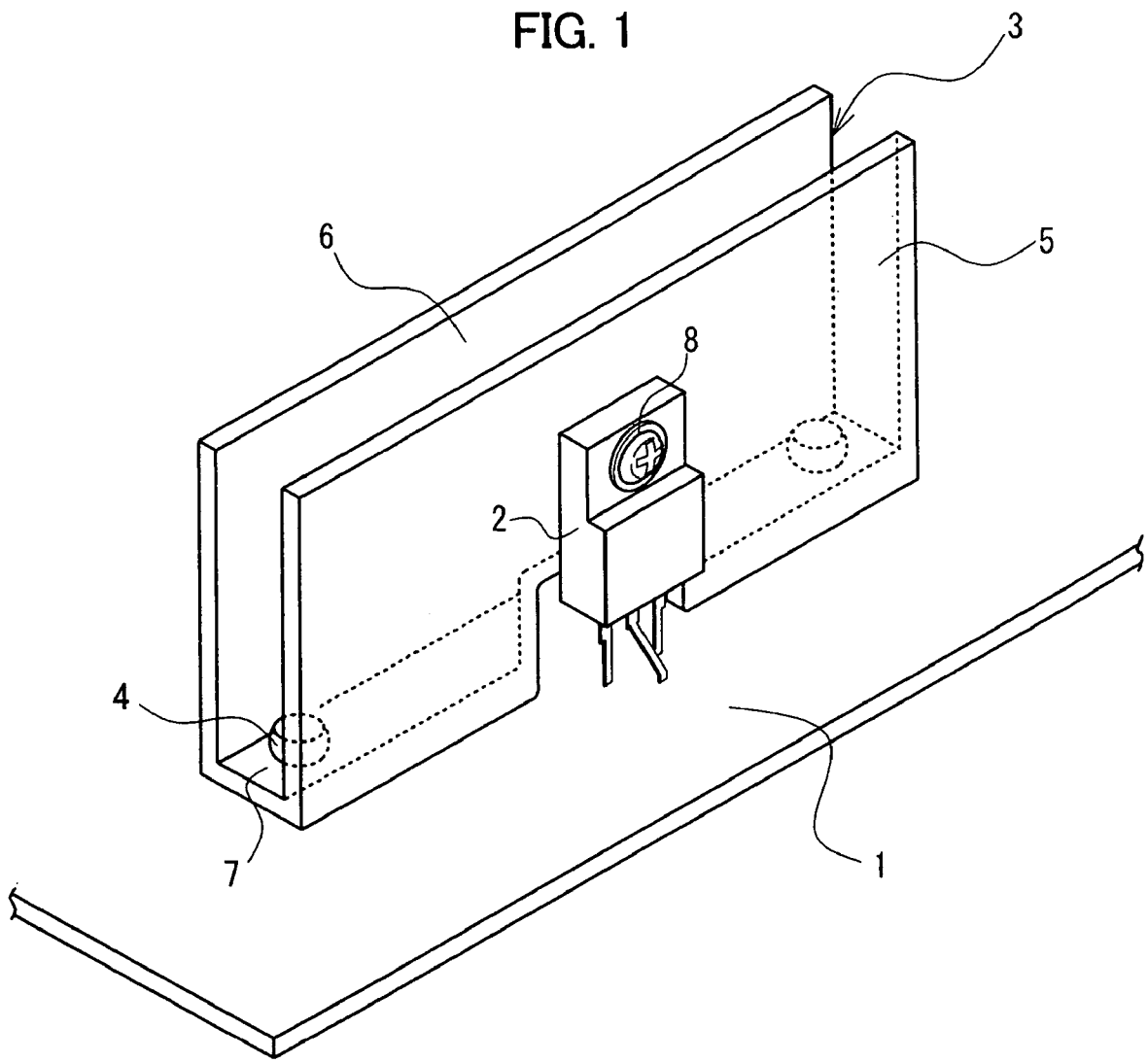
FIG. 1 is a perspective view showing a heatsink used in a circuit board of a power supply and a fixing structure of the heatsink in accordance with an embodiment of the present invention.
Figure 2:
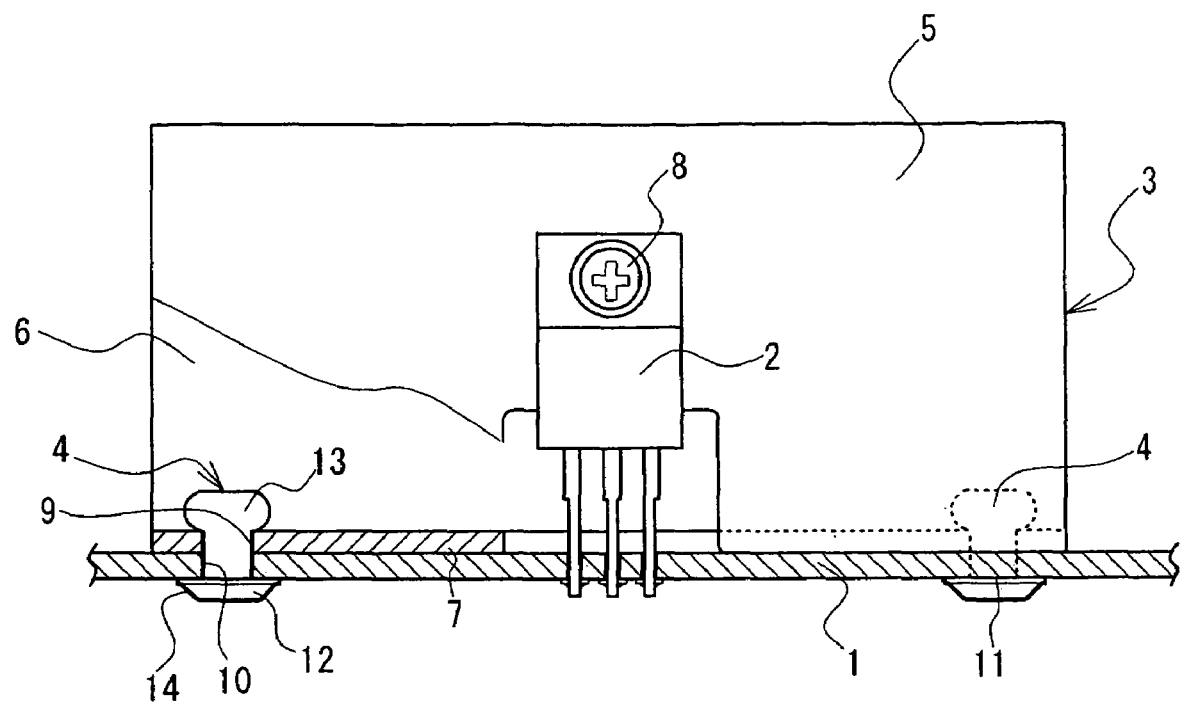
FIG. 2 is a front view showing the heatsink and the fixing structure.
Figure 3:
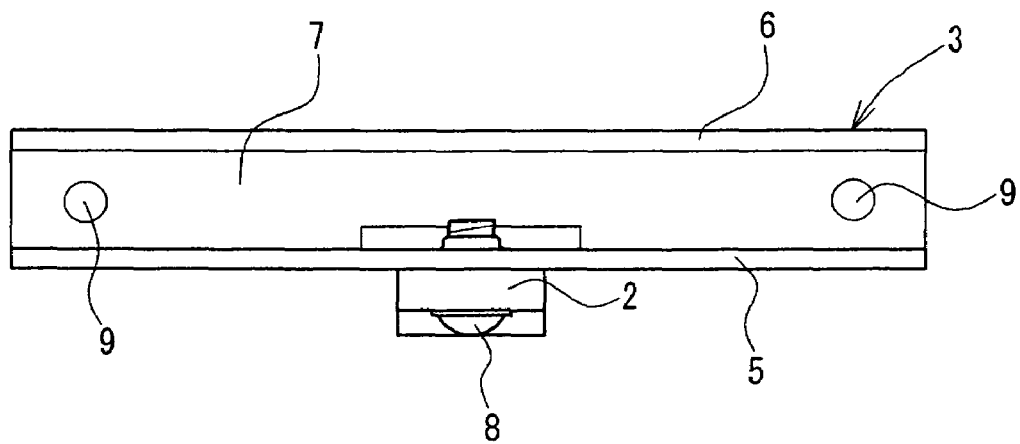
FIG. 3 is a plan view showing the heatsink.
Figure 4:
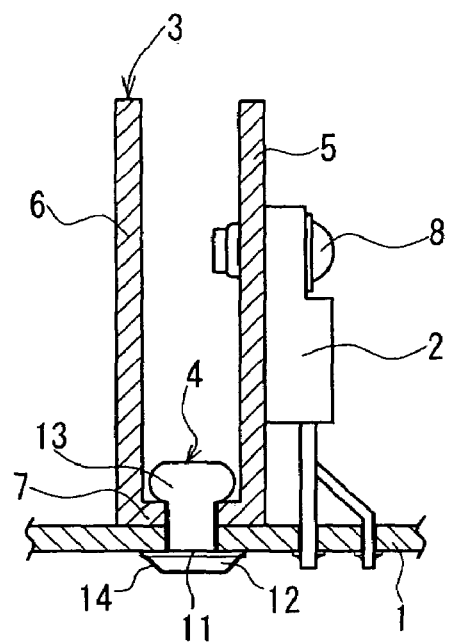
FIG. 4 is a side view showing the heatsink and the fixing structure.
Figure 5:
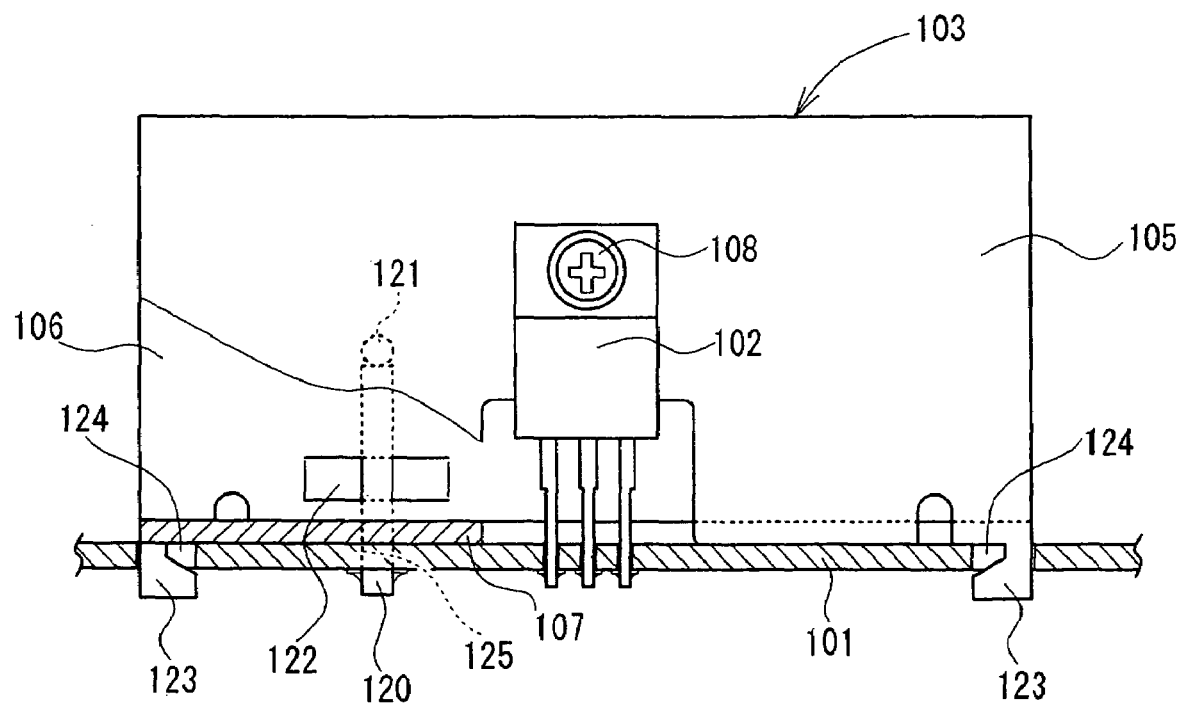
FIG. 5 is a front view showing a heatsink used in a circuit board of a conventional power supply and a conventional fixing structure of the heatsink.
Figure 6:
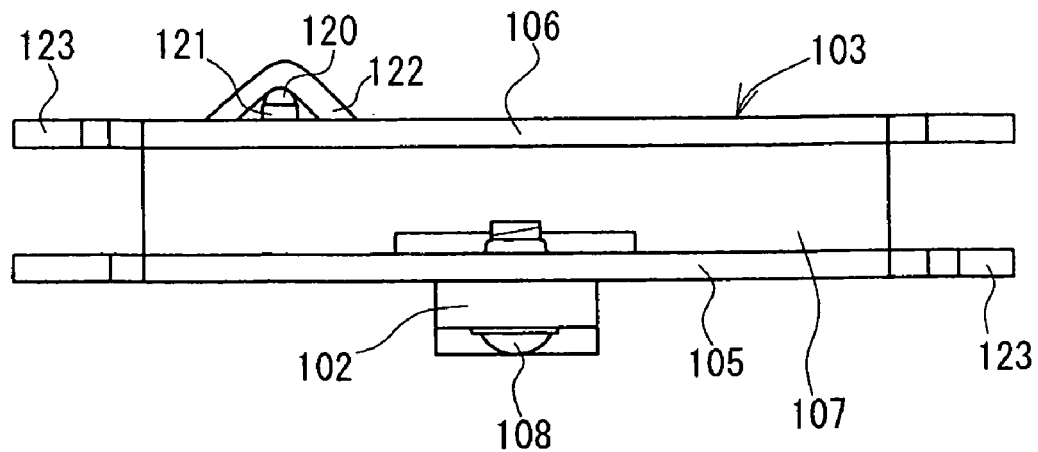
FIG. 6 is a plan view showing the conventional fixing structure of the heatsink.

A power supply and a fixing structure of a heatsink on a circuit board used in the power supply, and the circuit board applicable to the power supply in accordance with an embodiment of the present invention are described with reference to the figures. FIGS. 1 to 4 respectively show a heatsink (radiator) used in a circuit board of a power supply and a fixing structure of the heatsink on the circuit board.

The power supply has a circuit board 1 on which a wiring pattern is formed, an electronic component 2 such as a power transistor installed on the circuit board in an upright position, a heatsink 3 attached to the circuit board 1 in an upright position and a rivet 4 for fixing the heatsink 3 to the circuit board 1.

The heatsink 3 is formed by bending an aluminum plate in a substantially right-angular cornered U-letter shape or cutting an extruded member made of aluminum having a right-angular cornered U-letter shaped cross section by a predetermined size. The electronic component 2 is mounted closely on a component attachment face 5 of the heatsink 3. A bottom face (board contact face) 7 coupling the component attachment face 5 to a back face 6 is brought into contact with the circuit board 1.

The electronic component 2 is attached to the heatsink 3 at substantially the center thereof by using a screw 8. In order to prevent interference with terminals of the electronic component 2, the component attachment face 5 of the heatsink 3 is cut on the periphery of the terminals. A first rivet insertion hole 9, into which a tip of the rivet 4 is inserted, is formed in the vicinity of each of both ends of the bottom face 7.

On the other hand, a second rivet insertion hole 10 is provided on the circuit board 1 at a position corresponding to the first rivet insertion hole 9, and a land portion 11 connected to a grounding line of the circuit board 1 is provided at the periphery of the second rivet insertion hole 10. A diameter of the land portion 11 is set to be substantially equal to but slightly larger than a diameter of a flange end portion 12 of the rivet 4, so that the land portion 11 may come into contact with the flange end portion 12 securely.

In this embodiment, a blind rivet made of iron, which can be tightened from one side of a base material, is used as the rivet 4. For tightening the rivet 4, a blind riveter driven by oil pressure, compressed air or the like is used. That is, a tip of the rivet 4 is crimped with the blind riveter operated from the side of the circuit board under a condition where the tip of the rivet 4 penetrates through the second rivet insertion hole 10 and the first rivet insertion hole 9. Thereby, the circuit board 1 and the bottom face 7 of the heatsink 3 are held between a tip crimped portion 13 and a flange end portion 12 to be jointed to each other.

Figure 7:
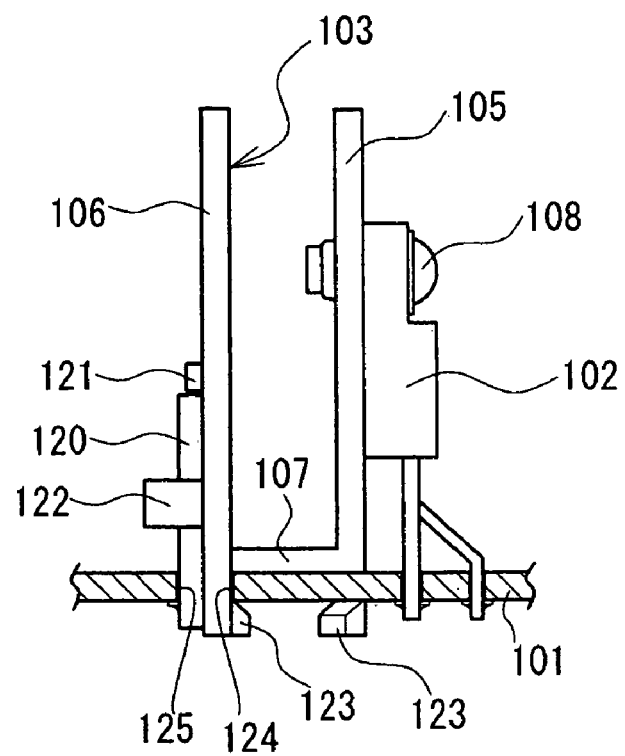
FIG. 7 is a side view showing the conventional fixing structure of the heatsink.

Generally, when the circuit board 1 is joined to the heatsink 3 using the rivet 4, the binding strength is dramatically increased in comparison with the conventional configuration in which the fixing portion 123 of the heatsink 103 is bent as shown in FIG. 7. Furthermore, in this embodiment, since the iron rivet 4 is used, the binding strength is further increased in comparison with the case where the aluminum rivet is used. In this manner, the tip crimped portion 13 of the rivet 4 and the bottom face 7 of the heatsink 3 as well as the flange end portion 12 of the rivet 4 and the land portion 11 of the circuit board 1 are firmly connected to each other, thereby stabilizing the contact state, that is, the electrical connection state.

After tightening the rivet 4, the circuit board 1 on which the other electronic components are mounted is dipped in a molten solder tank in the following dipping process. Hereupon, in this embodiment, since the iron rivet 4 is used, a molten solder 14 spreads through a gap between the land portion 11 and the flange end portion 12 of the rivet 4 and its periphery in the dipping process, and the electrical connection between both the portions can be further ensured. Since the blind riveter for fastening the rivet 4 is driven by oil pressure or the like, the burden imposed on an operator can be reduced in comparison with the conventional process of twisting the fixing portion 123 being held with pliers or the like.

As described above, according to the power supply in accordance with this embodiment, since the heatsink 3 is fixed to the circuit board 1 in an extremely rigid manner using the iron rivet 4, the electrical connection between the rivet 4 and the heatsink 3 can be stabilized. Furthermore, the rivet 4 is electrically connected to the land portion 11 securely due to the binding strength of the rivet 4 and the molten solder 14, the electrical connection between the rivet 4 and the land portion 11 can be also ensured. As a result, the heatsink 3 can be electrically connected to the grounding line securely and the operation of the power supply can be stabilized. Since the heatsink 3 is easily fixed on the circuit board 1 while these components are in close contact with each other by using the blind riveter driven by oil pressure or the like, the burden imposed on the operator can be reduced in comparison with the conventional process of twisting the fixing portion 123 being held with pliers, or the like, and the productivity of the power supply can be improved.

The present invention is not limited to the above-mentioned configuration and it is only necessary that the heatsink be fixed on the circuit board with the rivet made of a material which can be soldered, and the rivet be soldered to the grounding line of the circuit board. Although various modifications can be made to the present invention and for example, the above-mentioned fixing structure of the heatsink 3 is preferably used for the electronic component 2 installed in the power supply of the image forming device, and so on, the fixing structure can be also widely applied to the electronic component installed on a circuit board of another device as long as it is an electronic component which generates much heat and thus requires heat radiation. The heatsink 3 is not necessarily formed in the shape as shown in FIGS. 1 to 4, and for example, it may be configured so that the component attachment face 5 and the back face 7 form the L-letter shape.

This application is based on Japanese patent application 2005-7744 filed Jan. 14, 2005 in Japan, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A fixing structure of a heatsink on a circuit board on which a wiring pattern is formed, wherein
    an electronic component is installed on the circuit board in an upright position;
    the heatsink has a U-shaped cross section, with a base and first and second substantially parallel legs extending from edges of the base, the heatsink being attached to the circuit board in an upright position so as to closely contact the electronic component for radiating heat generated from the electronic component;
    the heatsink has a component fixing face defined by a front face of the first leg on which the electronic component is fixed, the second leg not receiving a component, and a board contact face defined by a bottom face of the base which is orthogonal to the component fixing face and in direct contact with the circuit board;
    the component fixing face and the board contact face having a common cut out portion defined by contiguous portions of the base and first leg to prevent interference with terminals of the electronic component;
    the board contact face of the heatsink has a first rivet insertion hole through which a tip of a rivet penetrates;
    the circuit board has a second rivet insertion hole provided at a position corresponding to the first rivet insertion hole of the heatsink and a land portion provided on a periphery of the second rivet insertion hole so as to come into direct contact with an end portion of a flange of the rivet inserted into the second rivet insertion hole, the land portion having a diameter substantially equal to and slightly larger than a diameter of the flange end portion;
    the land portion is connected to a grounding line of the circuit board; and
    the heatsink and the circuit board are held by the rivet inserted into the first and second rivet insertion holes, between the flange end portion and a tip crimped portion of the rivet, and the electrical connection between the grounding line of the circuit board and the heatsink is ensured via the rivet, wherein
    a gap is formed between the flange of the rivet and the land portion of the circuit board connected to the grounding line, the gap being filled with solder dip material.

2. The fixing structure in accordance with claim 1, wherein
the heatsink is made of aluminum and the rivet is made of a material which can be soldered; and
the land portion is electrically connected to the end portion of the flange of the rivet with certainty by using the solder dip spreading through the gap between the land portion, the flange end portion of the rivet and their peripheries.

3. A fixing structure of a heatsink on a circuit board on which a wiring pattern is formed, wherein
an electronic component is installed on the circuit board in an upright position;
the heatsink having a U-shaped cross section, with a base and first and second substantially parallel legs extending from edges of the base, and being attached to the circuit board in an upright position to closely contact the electronic component for radiating heat generated from the electronic component;
the heatsink having a component fixing face defined by a front face of the first leg on which the electronic component is fixed, the second leg not receiving a component, and a board contact face defined by a bottom face of the base which is orthogonal to the component fixing face and in direct contact with the circuit board;
the component fixing face and the board contact face having a common cut out portion defined by contiguous portions of the base and first leg to prevent interference with terminals of the electronic component;
the board contact face of the heatsink having a first rivet insertion hole through which a tip of an iron rivet penetrates beyond the board contact face;
the circuit board having a second rivet insertion hole at a position corresponding to the first rivet insertion hole of the heatsink, and a land portion provided on a periphery of the second rivet insertion hole coming into direct contact with an end portion of a flange of the iron rivet inserted into the second rivet insertion hole, the land portion having a diameter substantially equal to and slightly larger than a diameter of the flange end portion;
the land portion being connected to a grounding line of the circuit board; and the heatsink and the circuit board being held by the iron rivet inserted through the first and second rivet insertion holes, between the flange end portion and a tip crimped portion of the iron rivet, the iron rivet providing the electrical connection between the grounding line of the circuit board and the heatsink, wherein
a gap is formed between the flange of the rivet and the land portion of the circuit board connected to the grounding line, the gap being filled with solder dip material.

* * * * *